US007582395B2

(12) United States Patent
Chiu et al.

(10) Patent No.: US 7,582,395 B2
(45) Date of Patent: Sep. 1, 2009

(54) OVERLAY MARK

(75) Inventors: Chui-fu Chiu, Taoyuan County (TW); Wen-Bin Wu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 117 days.

(21) Appl. No.: 11/513,288

(22) Filed: Aug. 31, 2006

(65) Prior Publication Data

US 2008/0032205 A1 Feb. 7, 2008

(30) Foreign Application Priority Data

Aug. 4, 2006 (TW) .............................. 95128680 A

(51) Int. Cl.
*G03F 9/00* (2006.01)

(52) U.S. Cl. .......................................... 430/5; 257/797

(58) Field of Classification Search ..................... 430/5; 257/797
See application file for complete search history.

*Primary Examiner*—Christopher G Young
(74) *Attorney, Agent, or Firm*—Birch, Stewart, Kolasch & Birch, LLP

(57) ABSTRACT

An overlay mark formed on a photomask, comprising a first rectangular region, a second rectangular region, a third rectangular region, and a fourth rectangular region, each rectangular region having the same pattern configuration, a longer side of the first rectangular region and a longer side of the third rectangular region being parallel to each other, and a longer side of the second rectangular region and a longer side of the fourth rectangular region being parallel to each other, the longer side of the first rectangular region being perpendicular to the longer side of the second rectangular region; wherein each pattern configuration has at least two different pattern elements allowing other pattern elements be chosen to align when any one of the pattern elements on the substrate was damaged during process.

4 Claims, 7 Drawing Sheets

OVERLAY MARK

FIELD OF INVENTION

The present invention generally relates to an overlay mark, and more particularly, to an overlay mark used for overlaying alignment between photomasks during integrated circuit (IC) process.

BACKGROUND OF THE INVENTION

Photolithography is one of the most critical steps in IC manufacturing process. The quantity of photomask and lithography needed in the process indicates the integration complication of the IC. The improvement of lithography determines whether the IC can have a smaller feature dimension than previous generation. Exposure of photo-resist is one of the critical steps in lithography process due to its accuracy requirement. As mentioned above, the IC manufacturing process involves typically more than ten photomasks of different patterns, the alignment between the photomasks critically determines the quality of patterns transferred to the target layer and the final performance of the IC.

As well known in the arts, the step and repeat projection exposure step is to scale down for 4 to 10 times the patterns on the photomask on surface of substrate for each step, and multiple steps are repeated to complete the exposure for the entire substrate of wafer, as indicated in FIG. 1. The apparatus used for executing the exposure step is the so-called Stepper, which typically employing charge-coupled diode (CCD) camera for alignment purpose. As illustrated in FIG. 1, light source 11 typically may be the Ultra-Violet light emitted by mercury arc lamp, or other light source facilitating the same purpose. The photomask 12 has device patterns thereon, and additional overlay mark 13 positioned at the edge of the photomask 12, the alignment must be assured before each exposure is performed. As indicated, through the lens 14, the device patterns on the photomask 12 and the overlay mark 13 are transferred to the surface of the wafer 15. Compared to the actual size, the pattern on the photomask 13 is magnified, and the pattern is shrunk to actual size by lens 14 and transferred on one location of the wafer during exposure step. Since the lithography process is well known in the arts, the details of the process are not further described herein.

The well known overlay marks, such as Box-in-Box (BiB) and Advanced Imaging Metrology (AIM) are generally used for the overlaying alignment between photomasks. As indicated in FIG. 2A, a BiB overlay mark 20 according to the prior arts is provided on the photomask as having a first rectangular region 21, a second rectangular region 22, a third rectangular region 23 and a fourth rectangular region 24. The longer side of the first rectangular region 21 and the longer side of the third rectangular region 23 are parallel to each other, the longer side of the second rectangular region 22 and the longer side of the fourth rectangular region 24 are parallel to each other. The longer side of the first rectangular region 21 or the third rectangular region 23 is perpendicular to the longer side of the second rectangular region 22 or the fourth rectangular region 24. Namely, along the horizontal and vertical directions, there are two parallel and symmetrical rectangular regions respectively. Alternatively, these four regions may be independently an open region or may be connected to each other by joining tail of one region to head of the connecting region.

FIG. 2B illustrates a mark pattern 30 previously formed on the substrate after the previous process is completed. The mark pattern 30 includes a first aligned rectangular region 31*a*, a second aligned rectangular region 32*a*, a third aligned rectangular region 33*a* and a fourth aligned rectangular region 34*a*.

The alignment configuration 40 is illustrated in FIG. 2C. As mentioned above, the pattern in FIG. 2A is transferred on the photo-resist to form a first rectangular region 31*b*, a second rectangular region 32*b*, a third rectangular region 33*b* and a fourth rectangular region 34*b*. By making measurement of orientation and/or gap between the first aligned rectangular region 31*a*, the second aligned rectangular region 32*a*, the third aligned rectangular region 33*a* and the fourth aligned rectangular region 34*a* and the first rectangular region 31*b*, the second rectangular region 32*b*, the third rectangular region 33*b* and the fourth rectangular region 34*b* respectively, the alignment step is performed. When the measured orientation and/or gap meet the predetermined criterion, the patternization is successful and process continues. However, when criterion is not met, the failure photo-resist at this stage must be removed and the lithography process is repeated again until the criterion is met.

The AIM overlay mark is designed using the optical metrology and is more dense than BiB overlay mark for reducing possible inaccuracy during manufacturing process. In addition, the BiB overlay mark on the layer of wafer may be eroded after processes including etching, CMP or ion implant such that alignment procedure can not be performed accurately. In contrast, the AIM overlay mark has lesser open area lowering possibility of erosion during processes and, therefore, enhancing alignment accuracy between photomasks.

As indicated in FIG. 3A, an AIM overlay mark 50 according to the prior arts is provided on the photomask as having a first rectangular region 51, a second rectangular region 52, a third rectangular region 53 and a fourth rectangular region 54. The longer side of the first rectangular region 51 and the longer side of the third rectangular region 53 are parallel to each other, the longer side of the second rectangular region 52 and the longer side of the fourth rectangular region 54 are parallel to each other. The longer side of the first rectangular region 51 or the third rectangular region 53 is perpendicular to the longer side of the second rectangular region 52 or the fourth rectangular region 54. Namely, along the horizontal and vertical directions, there are two parallel and symmetrical rectangular regions respectively.

FIG. 3B illustrates a mark pattern 60 previously formed on the substrate after the previous process is completed. The mark pattern 60 includes a first aligned rectangular region 61*a*, a second aligned rectangular region 62*a*, a third aligned rectangular region 63*a* and a fourth aligned rectangular region 64*a*.

The alignment configuration 70 is illustrated in FIG. 3C. As mentioned above, the pattern in FIG. 3A is transferred on the photo-resist to form a first rectangular region 61*b*, a second rectangular region 62*b*, a third rectangular region 63*b* and a fourth rectangular region 64*b*. By making measurement of orientation and/or gap between the first aligned rectangular region 61*a*, the second aligned rectangular region 62*a*, the third aligned rectangular region 63*a* and the fourth aligned rectangular region 64*a* and the first rectangular region 61*b*, the second rectangular region 62*b*, the third rectangular region 63*b* and the fourth rectangular region 64*b* respectively, the alignment step is performed. When the measured orientation and/or gap meet the predetermined criterion, the patternization is successful and process continues. However, when criterion is not met, the failure photo-resist at this stage must be removed and the lithography process is repeated again until the criterion is met.

Due to continuing demand for further down-scaling of IC process, further accuracy of photophotomasks alignment becomes an important issue which is to be resolved by any improved overlay mark configuration such as that disclosed by this application.

SUMMARY OF THE INVENTION

In a preferably embodiment of the present invention, an overlay mark formed on a photomask, comprising a first rectangular region, a second rectangular region, a third rectangular region, and a fourth rectangular region, each rectangular region having the same pattern configuration, a longer side of the first rectangular region and a longer side of the third rectangular region being parallel to each other, and a longer side of the second rectangular region and a longer side of the fourth rectangular region being parallel to each other, the longer side of the first rectangular region being perpendicular to the longer side of the second rectangular region; wherein each pattern configuration has at least two different pattern elements allowing other pattern elements be chosen to align when any one of the pattern elements on the substrate was damaged during process.

In another preferably embodiment of the present invention, there is a photomask having an overlay mark, and the overlay mark comprises a first rectangular region, a second rectangular region, a third rectangular region, and a fourth rectangular region, each rectangular region having the same pattern configuration, a longer side of the first rectangular region and a longer side of the third rectangular region being parallel to each other, and a longer side of the second rectangular region and a longer side of the fourth rectangular region being parallel to each other, the longer side of the first rectangular region being perpendicular to the longer side of the second rectangular region; wherein each pattern configuration has at least two different pattern elements allowing other pattern elements be chosen to align when any one of the pattern elements on the substrate was damaged during process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

Figure 4:
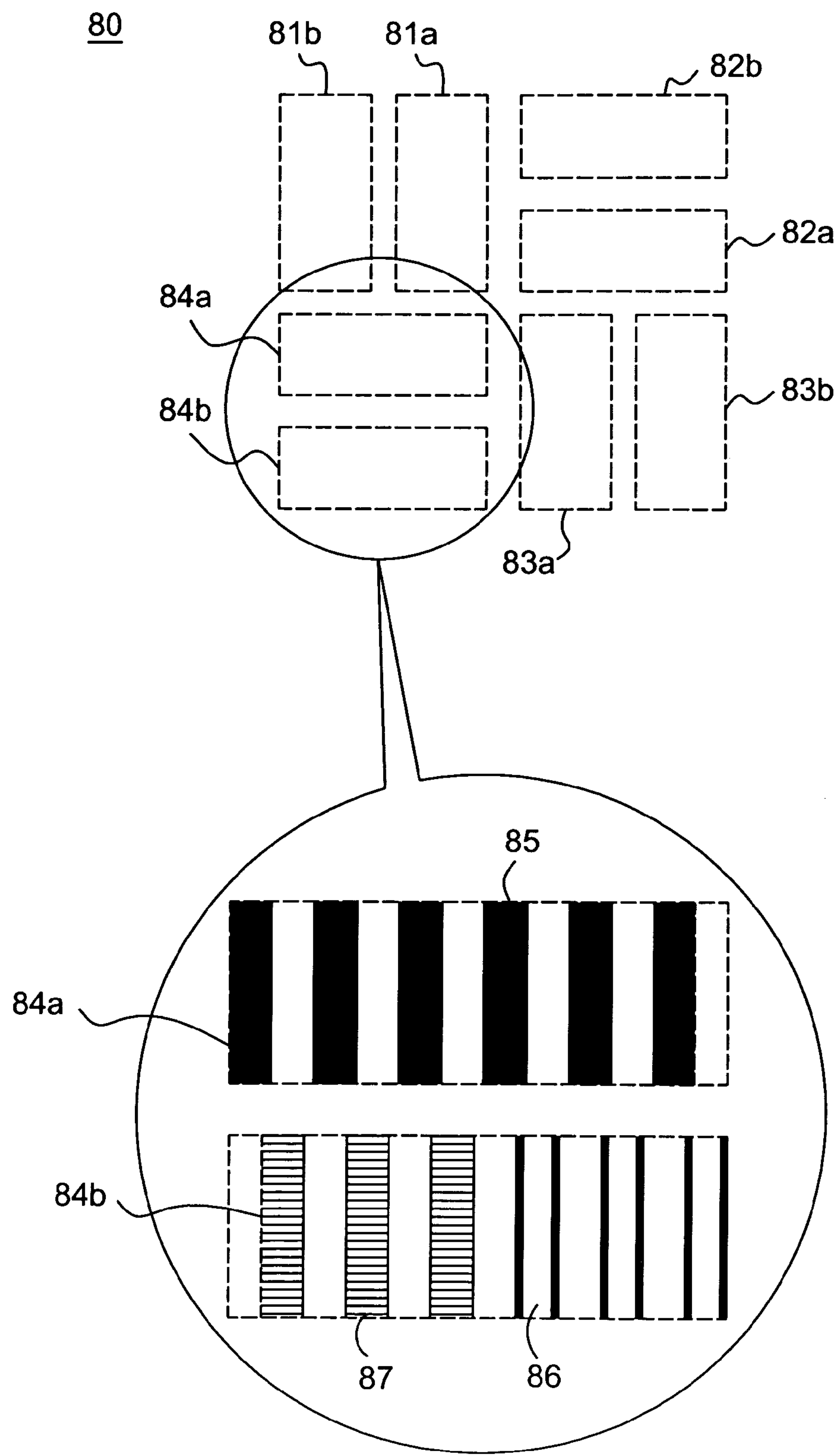
FIG. 4 illustrates an overlaying structure of AIM overlay mark patterns of the present invention.
Figure 5:
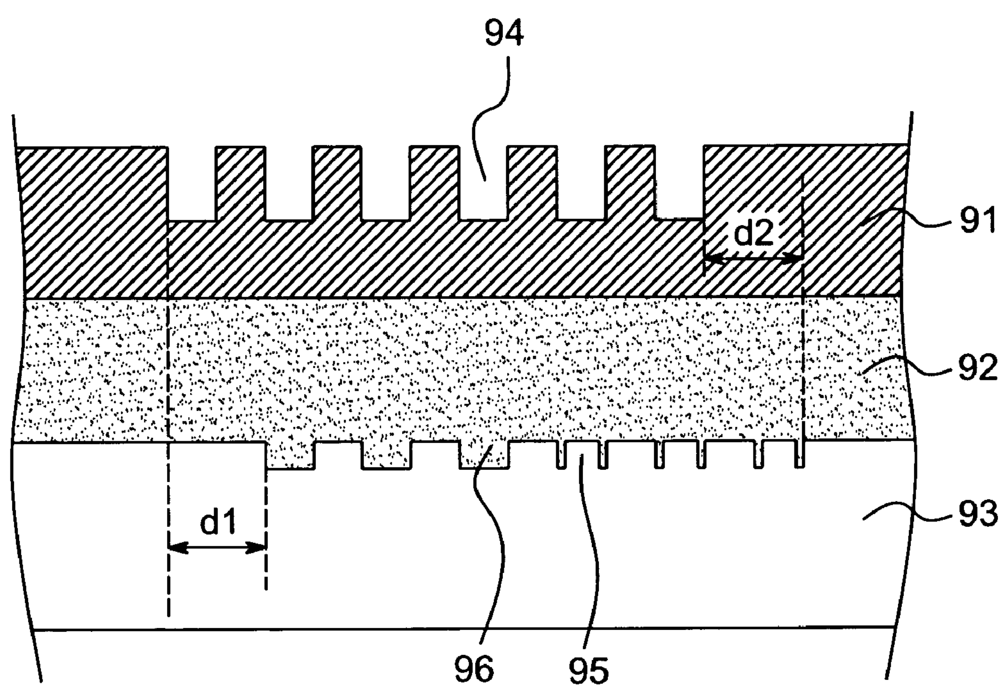
FIG. 5 illustrates a cross-section view of an overlaying structure of the present invention.

Referring now to the drawings, and more particular to FIGS. 4-5, there are shown exemplary embodiments of the overlay mark configuration according to the present invention.

Figure 1:
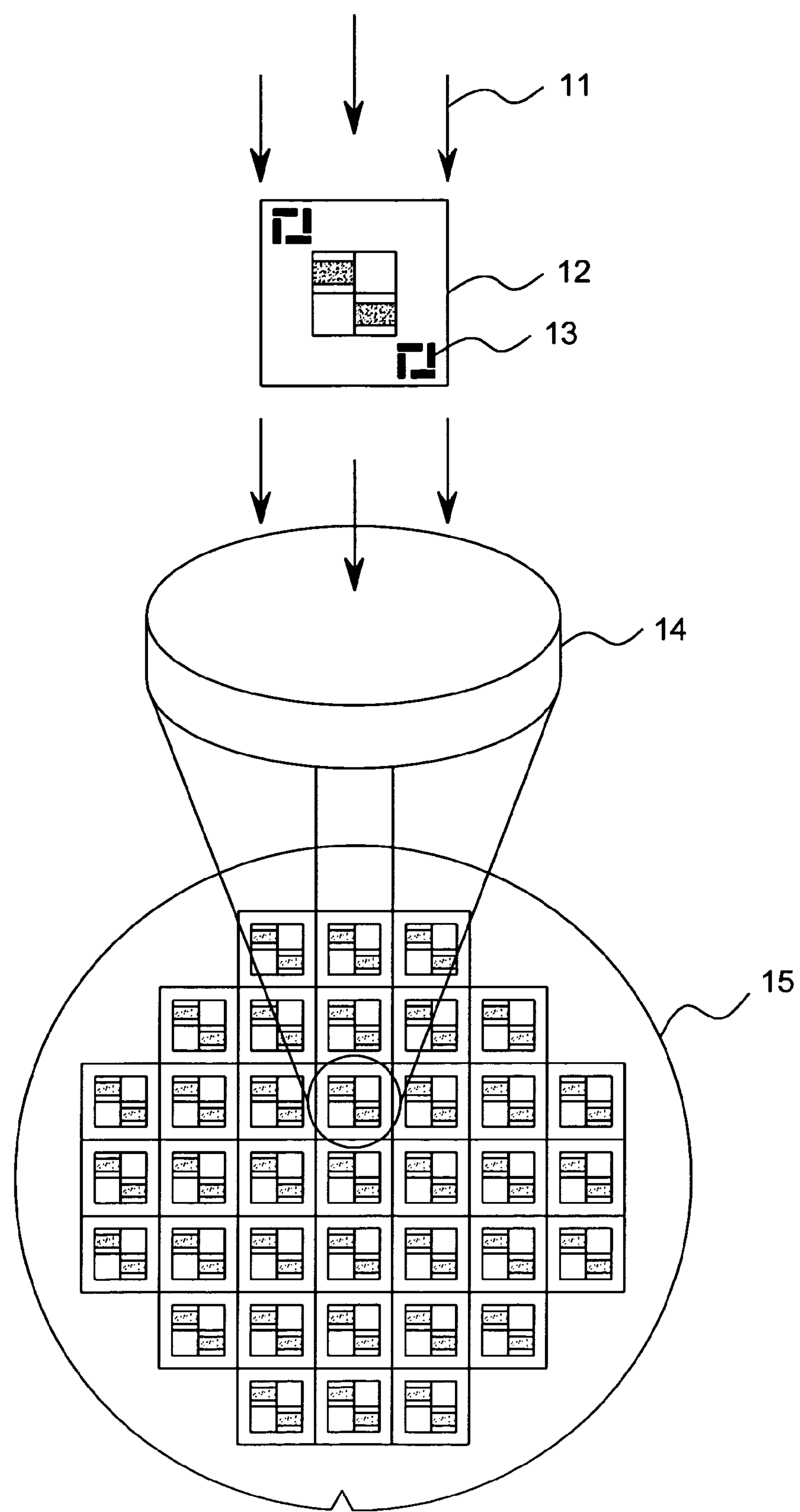
FIG. 1 illustrates a schematic drawing of step and repeat projective exposure.
Figure 2A:
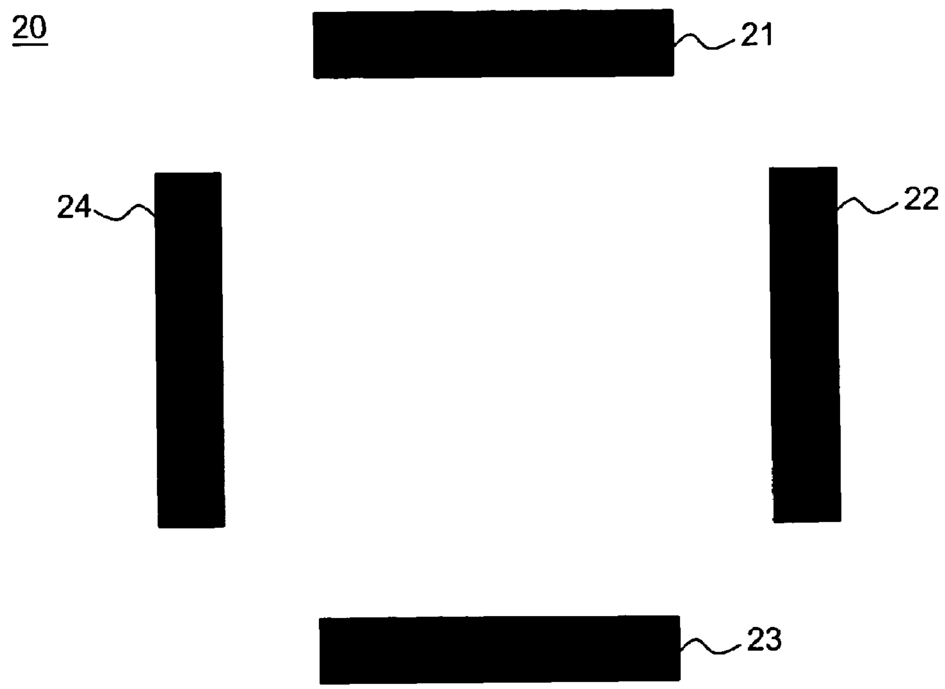
FIG. 2A illustrates a BiB overlay mark designed on a photomask as in prior technique.
Figure 2B:
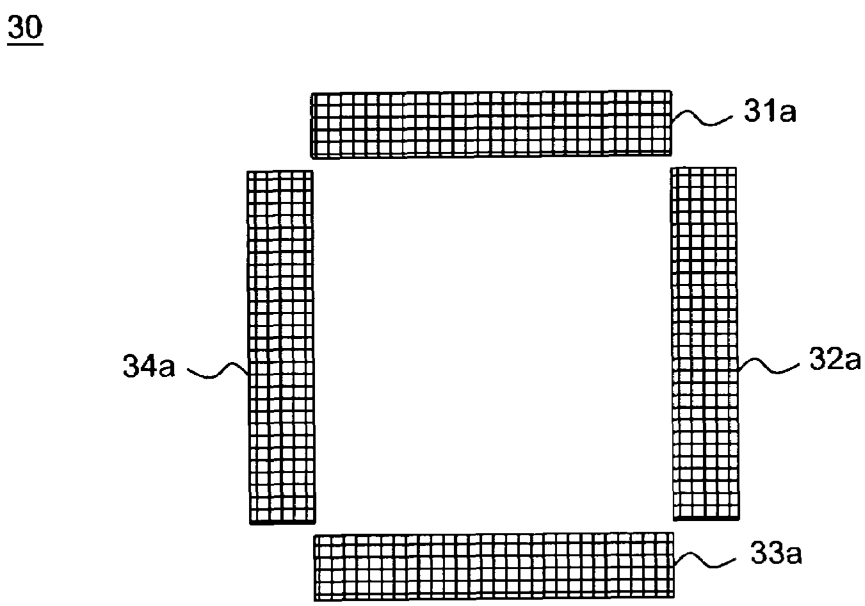
FIG. 2B illustrates a BiB aligned mark pattern formed on a substrate.
Figure 2C:
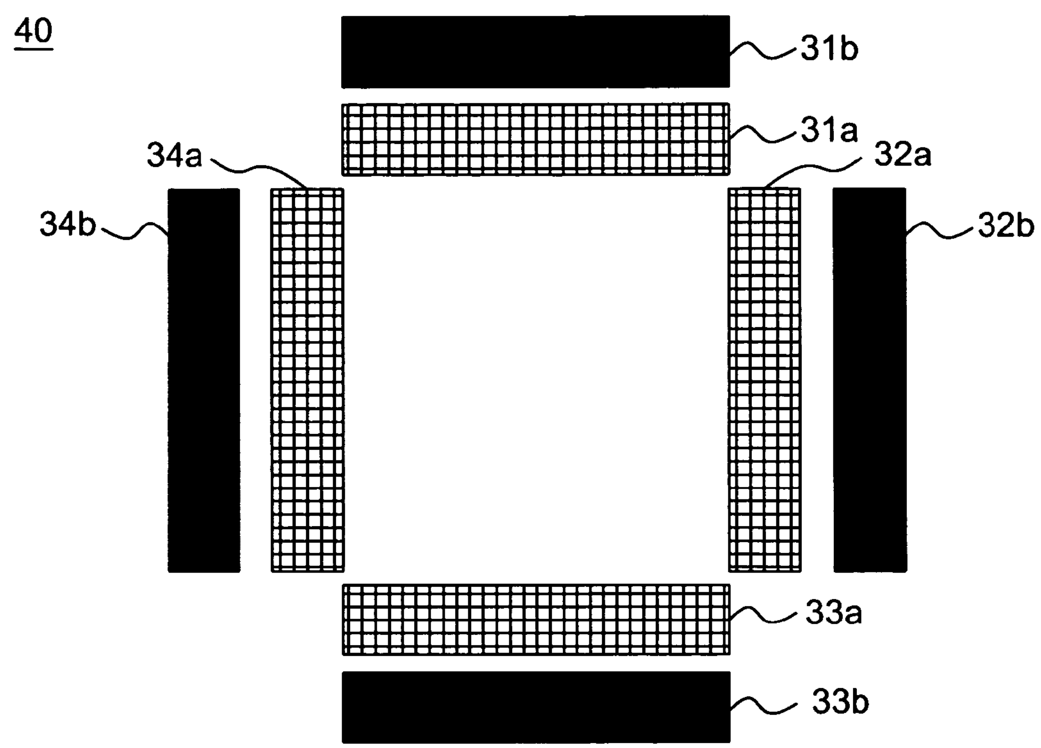
FIG. 2C illustrates an aligned structure of overlaying patterns formed by BiB overlay mark.
Figure 3A:
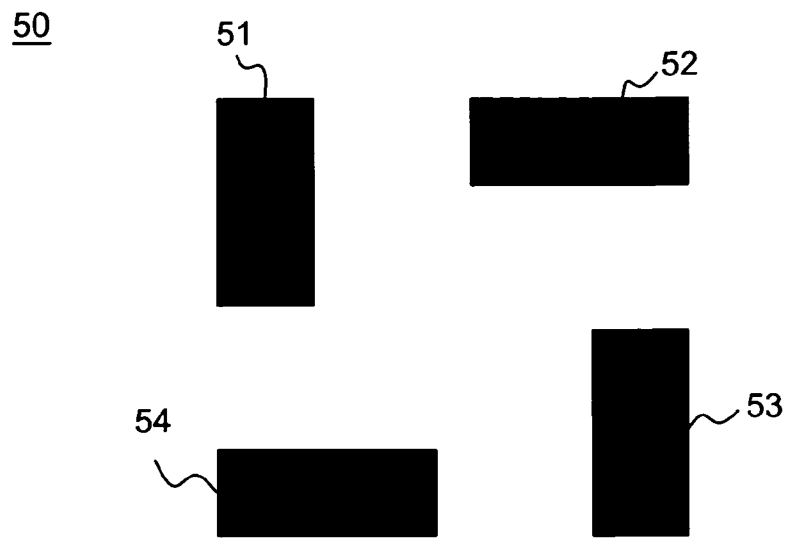
FIG. 3A illustrates a AIM overlay mark designed on a photomask as in prior technique.
Figure 3B:
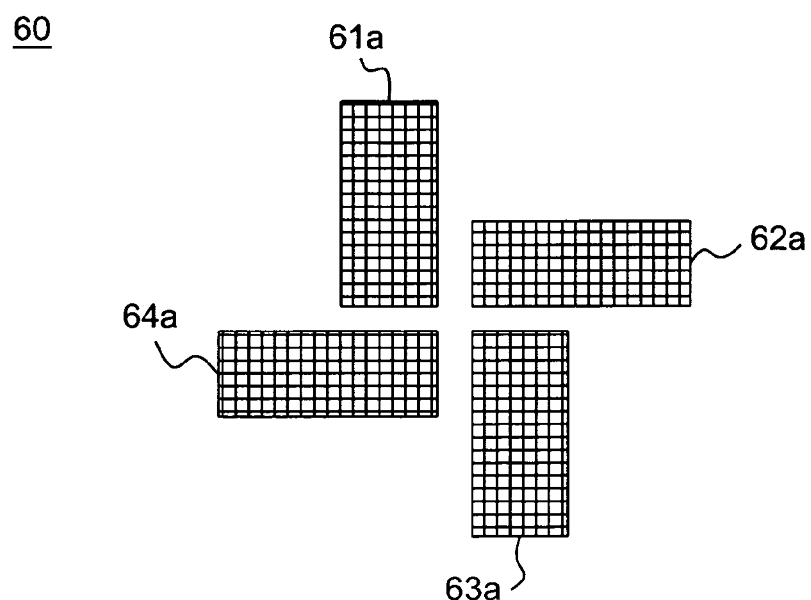
FIG. 3B illustrates an AIM aligned mark pattern formed on a substrate.
Figure 3C:
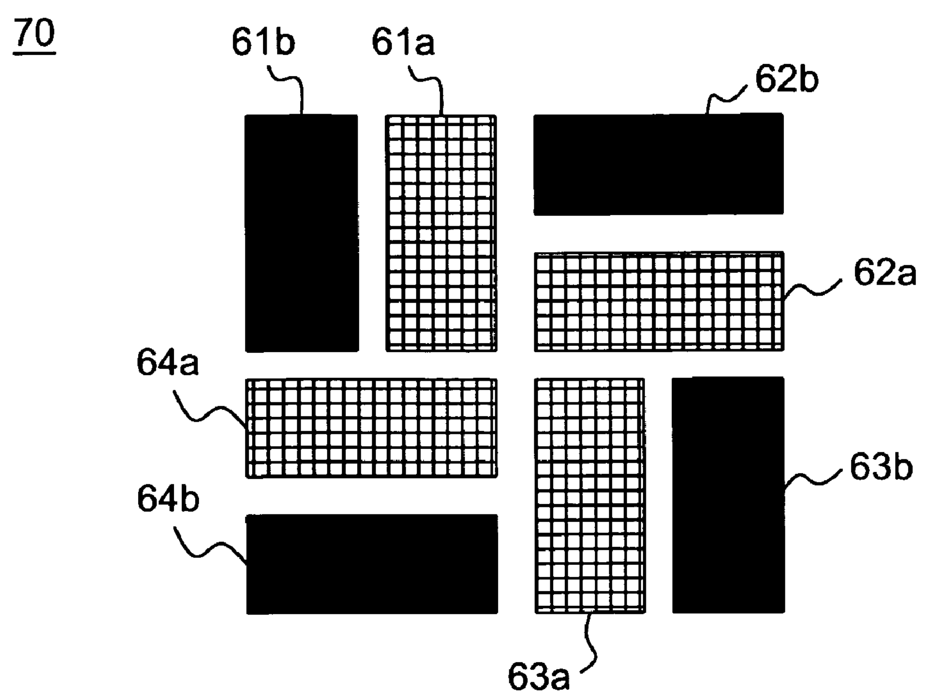
FIG. 3C illustrates an aligned structure of overlaying patterns formed by AIM overlay mark.

As indicated in FIG. 4, the embodiment discloses an AIM configuration with improved overlay mark. Similar to that disclosed in and described for FIG. 3C, this overlay configuration includes four aligned rectangular regions 81*a*, 82*a*, 83*a* and 84*a*, and four rectangular regions 81*b*, 82*b*, 83*b* and 84*b*. As the fourth rectangular region 84*b* and the fourth aligned rectangular region 84*a* are enlarged, it is noted that the fourth aligned rectangular region 84*a* has plurality of first pattern elements 85 distributed evenly in the fourth aligned rectangular region 84*a*. Further, the fourth rectangular region 84*b* has plurality of second pattern elements 86 and third pattern elements 87 distributed according to a predetermined way. When transferred on the wafer, these pattern elements may form trenches or voids on corresponding layers of the wafer. Alternatively, the fourth rectangular region 84*b* includes more than three types of pattern elements.

It is noted that even the AIM overlay mark on the layer of wafer may be eroded after processes including etching, CMP or ion implant such that alignment procedure can not be performed accurately. However, the provision of at least two pattern elements by the embodiment allows other pattern elements be chosen to align when any one of the pattern elements above the substrate is damaged during process.

FIG. 5 is the cross-section view of an overlay configuration 90 when implemented on the wafer. In the figure, the first trench 95 and the second trench 96 are formed on the substrate 93 corresponding to different pattern elements 86 and 87 of the overlay mark in FIG. 4. In succession, a priming step on the substrate 93 is performed for enhancing adhesive capability between the photo-resist and the substrate 93. This priming step involves usage of Hexamethyldisilazane (HMDS) layer 92. Afterwards, the photo-resist 91 is coated and the overlay mark on the succeeding photomask is transferred to the photo-resist 91 as the mark pattern 94. The measured distance $d_1$ provided by the first trench 95 and the mark pattern 94 can be used to perform the alignment procedure. However, if the first trench 95 is damaged for whatever reasons disallowing role of alignment, the measured distance $d_2$ provided by the second trench 96 and the mark pattern 94 then can be used as a backup for alignment procedure.

By means of the detailed descriptions of what is presently considered to be the most practical and preferred embodiments of the subject invention, it is expected that the features and the gist thereof be clearly described. Nevertheless, these embodiments are not intended to be construed in a limiting sense. Instead, it will be well understood that any analogous variations and equivalent arrangements will fall within the spirit and scope of the invention.

What is claimed is:

1. An overlay mark formed on a photomask having a first rectangular region, a second rectangular region adjacent to the first rectangular region, a third rectangular region diagonal relative to the first rectangular region and adjacent to the second rectangular region, and a fourth rectangular region diagonal relative to the second rectangular region and adjacent to both the first rectangular region and the third rectangular region, wherein each of the first rectangular region, the second rectangular region, the third rectangular region and the fourth rectangular region has a first pattern and a second pattern, the second pattern are composed of a first auxiliary pattern and a second auxiliary pattern distinct from the first auxiliary pattern.

2. The overlay mark of claim 1, wherein the first auxiliary pattern has a first orientation, and the second auxiliary pattern has a second orientation distinct from that of the first auxiliary pattern.

3. The overlay mark of claim 1, wherein the first auxiliary pattern has a first pattern density and the second auxiliary pattern has a second pattern density distinct from that of the first auxiliary pattern.

4. The overlay mark of claim 2, wherein the first auxiliary pattern has a first pattern density and the second auxiliary pattern has a second pattern density distinct from that of the first auxiliary pattern.

* * * * *